(12) United States Patent
Ho et al.

(10) Patent No.: US 7,654,436 B2
(45) Date of Patent: Feb. 2, 2010

(54) WIRE BONDING SYSTEM UTILIZING MULTIPLE POSITIONING TABLES

(75) Inventors: Wing Cheung James Ho, Hong Kong (HK); Hon Shing Eddie Law, Hong Kong (HK); Kam Hong Kenneth Lam, Hong Kong (HK); Wai Lok Ben To, Hong Kong (HK)

(73) Assignee: ASM Assembly Automation Ltd., Hong Kong (CN)

( * ) Notice: Subject to any disclaimer, the term of this patent is extended or adjusted under 35 U.S.C. 154(b) by 84 days.

(21) Appl. No.: 11/858,505

(22) Filed: Sep. 20, 2007

(65) Prior Publication Data

US 2009/0078743 A1 Mar. 26, 2009

(51) Int. Cl.
*B23K 31/02* (2006.01)

(52) U.S. Cl. ............... 228/180.5; 228/105; 228/4.5

(58) Field of Classification Search .............. 228/1.1, 228/4.5, 103, 105, 110.1, 180.5; 700/121; 414/788–798.9, 222.01–226.05, 334–336, 414/426–430
See application file for complete search history.

(56) References Cited

U.S. PATENT DOCUMENTS

| | | | | |
|---|---|---|---|---|
| 4,039,114 A | * | 8/1977 | Yoshida et al. | 228/1.1 |
| 4,763,827 A | * | 8/1988 | Watanabe et al. | 228/102 |
| 5,145,099 A | * | 9/1992 | Wood et al. | 228/9 |
| 5,226,582 A | * | 7/1993 | Kubota et al. | 228/180.5 |
| 2005/0247758 A1 | * | 11/2005 | Beatson et al. | 228/103 |
| 2007/0181645 A1 | * | 8/2007 | Ho et al. | 228/101 |

* cited by examiner

*Primary Examiner*—Jessica L. Ward
*Assistant Examiner*—Kevin E Yoon
(74) *Attorney, Agent, or Firm*—Ostrolenk Faber LLP

(57) ABSTRACT

A wire bonding apparatus and method in which separate first and second positioning tables are provided for mounting electronic devices to be wire bonded, and a bonding tool is provided at a bonding position for bonding the electronic devices. First and second loading/unloading positions are provided for loading electronic devices to or unloading electronic devices from the positioning tables. The first and second positioning tables are operative to move independently of each other, such that the first positioning table is movable between the first loading/unloading position and the bonding position and the second positioning table is movable between the second loading/unloading position and the bonding position.

10 Claims, 8 Drawing Sheets

WIRE BONDING SYSTEM UTILIZING MULTIPLE POSITIONING TABLES

FIELD OF THE INVENTION

The present invention relates to a wire bonding system for bonding semiconductor devices, and in particular, to a wire bonding system comprising multiple positioning tables on which devices to be bonded are placed.

BACKGROUND AND PRIOR ART

A typical wire bonding system includes a work holder mounted on a positioning table such as an X-Y table. A device that is placed onto the work holder to be wire-bonded may carry one or more materials such as an integrated circuit chip on-board ("COB") or a light-emitting diode ("LED"). The wire that is bonded may be made of gold or copper, for which ball bonding utilizing a capillary is typically used, or aluminum for which wedge bonding utilizing a wedge bonding tool is typically used. For wedge bonding applications, the wire bonding system may be fully-automatic or semi-automatic. Semi-automatic wire bonders require manual loading and unloading but have the advantage of flexibility when conversion of the wire bonding system for other types of electronic devices is required.

In a wire bonding system which uses a single worktable, the operations of wire bonding are sequential. For example, a material such as an LED board is first loaded onto a substrate. Then, pattern recognition ("PR") is conducted for visual alignment of the LED board and substrate using an optical system such as a CCD camera. After visual orientation, wire bonding is carried out on the LED board. The bonded LED board is unloaded once wire bonding is completed, before another LED board can be loaded onto the substrate to repeat the operations.

The sequential operations result in lower units per hour ("UPH") produced since time is consumed for non-productive operations such as loading/unloading of the device and pattern recognition. These operations are essential and cannot be eliminated. Therefore, it would be desirable to achieve a higher UPH by performing the productive bonding operation and the abovementioned non-productive operations simultaneously.

SUMMARY OF THE INVENTION

It is thus an object of this invention to seek to provide a wire bonding system which can improve UPH by performing productive bonding operations substantially in parallel with other, non-productive, operations such as loading/unloading and pattern recognition.

According to a first aspect of the invention, there is provided a wire bonding apparatus comprising: separate first and second positioning tables for mounting electronic devices to be wire bonded; a bonding position having a bonding tool where the positioning tables are locatable for bonding the electronic devices; and first and second loading/unloading positions for loading electronic devices to or unloading electronic devices from the positioning tables; wherein the first positioning table is operative to move between the first loading/unloading position and the bonding position independently of the second positioning table, and the second positioning table is operative to move between the second loading/unloading position and the bonding position independently of the first positioning table.

According to a second aspect of the invention, there is provided a method of bonding wires onto electronic devices comprising the steps of: mounting first and second electronic devices onto separate first and second positioning tables; positioning the first positioning table at a bonding position having a bonding tool and bonding the electronic device mounted on the first positioning table with the bonding tool; moving the first positioning table to a first loading/unloading position to remove the bonded electronic device from the first positioning table and replacing it with an unbonded electronic device; independently moving the second positioning table to the bonding position and bonding the electronic device mounted on the second positioning table with the bonding tool; moving the second positioning table to a second loading/unloading position to remove the bonded electronic device from the second positioning table and replacing it with an unbonded electronic device; and independently moving the first positioning table to the bonding position and bonding the electronic device mounted on the first positioning table with the bonding tool.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which.

DETAILED DESCRIPTION OF THE PREFERRED EMBODIMENTS OF THE INVENTION

The preferred embodiments of the present invention will be described hereinafter with reference to the accompanying drawings.

FIGS. 1A to 1D are functional block diagrams illustrating an exemplary wire bonding sequence according to a first preferred embodiment of the invention, comprising dual positioning tables and an optical system with one CCD camera 11 on a platform.

Figure 1A:
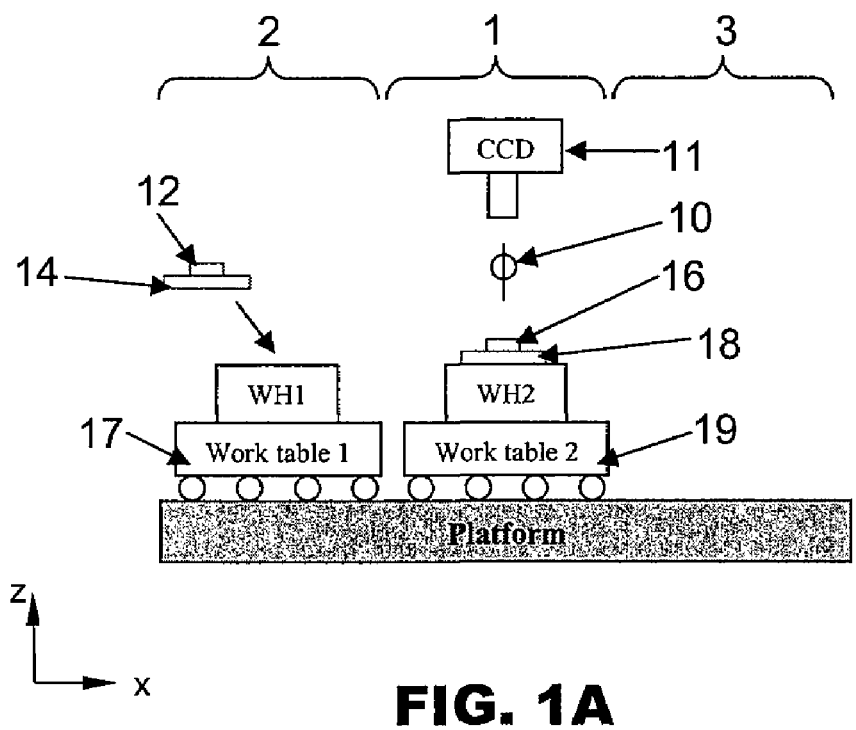
FIGS. 1A to 1D are functional block diagrams illustrating an exemplary wire bonding sequence according to a first preferred embodiment of the invention, wherein dual X-Y tables and an optical system with one CCD camera are in operation on a platform.

A platform with separate positioning tables, such as a first X-Y table 17 and a second X-Y table 19, are shown in FIG. 1A. The X-Y tables 17, 19 are configured to move independently of each other in the x and y directions. The first X-Y table 17 carries a first work holder WH1 for mounting one electronic device, while the second X-Y table 19 carries a second work holder WH2 for mounting another electronic device. Each electronic device may comprise an LED board mounted on a substrate. The CCD camera 11 and a bonding tool of a bond head 10 are positioned centrally on the platform at a bonding position 1 where the second X-Y table 19 is located for bonding. During wedge wire bonding, it is necessary to orientate the wedge-shaped bonding tool relative to the device to be bonded. This reorientation may be achieved by rotating a rotary bond head holding the bonding tool, or by rotating a rotary chuck that is holding the device to be bonded. On the other hand, for ball bonding applications, there is no need to rotate the cylindrically-shaped capillary of the bonding tool.

The platform has a first loading/unloading position 2, which may be to the left of the bonding position 1, and a second loading/unloading position 3, which may be to the right of the bonding position 1. The loading/unloading positions 2, 3 are for loading electronic devices to or unloading electronic devices from the X-Y tables 17, 19. A first substrate 14 mounted with a first material such as an LED board 12 is loaded onto the first work holder WH1 at the first loading/unloading position 2. Another LED board 16 is mounted on a second substrate 18 loaded onto the second work holder WH2. The CCD camera 11 carries out pattern recognition of the LED board 16 on the second work holder WH2 at the bonding position 1, which is then visually aligned for wire bonding by the bond head 10 at the same time as the first substrate 14 is loaded onto the first work holder WH1 at the first loading/unloading position 2.

Figure 1B:
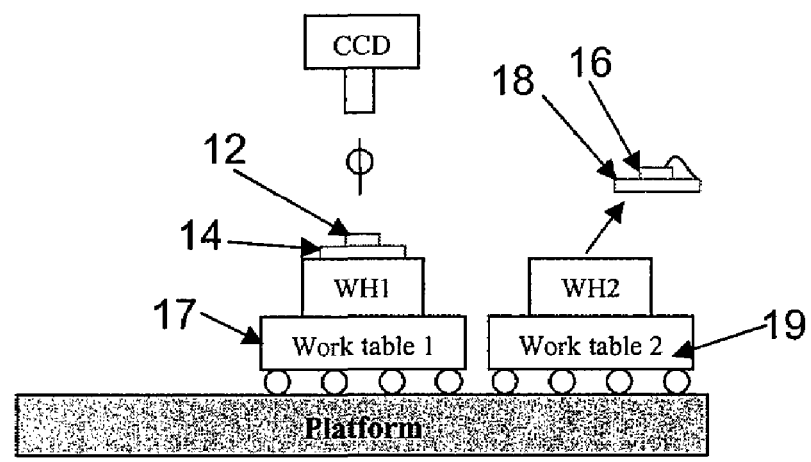

In FIG. 1B, after bonding is completed on the substrate 18 on the second work holder WH2 at the bonding position 1, the second X-Y table 19 moves to the right in the x direction and the first X-Y table 17 independently moves to the right in the same direction. The motions of the first and second X-Y tables 17, 19 preferably take place substantially simultaneously. The bonded substrate 18 may then be unloaded and removed from the second work holder WH2 at the second loading/unloading position 3. The first X-Y table 17 is now positioned below the CCD camera 11 at the bonding position 1, which carries out pattern recognition and visually aligns the LED board 12 before wire bonding on the substrate 14 commences.

Figure 1C:
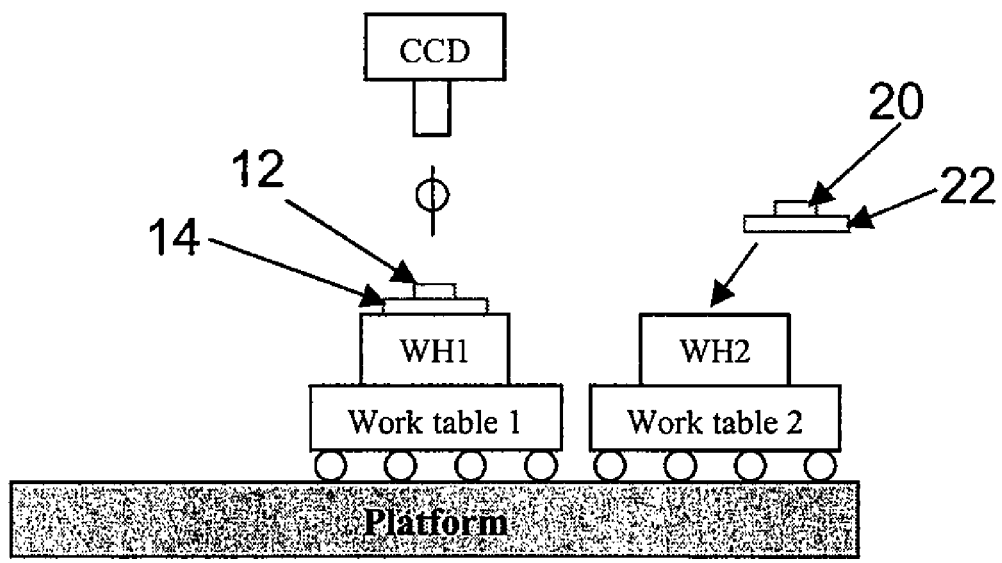

In FIG. 1C, a third substrate 22 with an unbonded LED board 20 is loaded onto the second work holder WH2 to replace the bonded LED board 16 at the second loading/unloading position 3 while bonding is carried out on the substrate 14 on the first work holder WH1 at the bonding position 1.

Figure 1D:
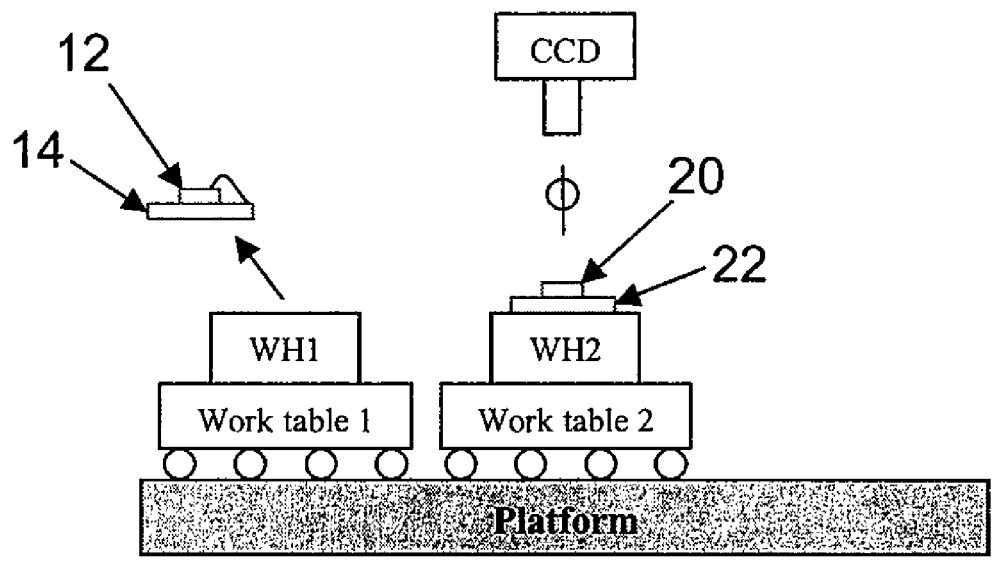

After bonding is completed on the first work holder WH1 in FIG. 1D, the first X-Y table 17 moves to the left in the x direction to the first loading/unloading position 2 while the second X-Y table 19 independently moves to the left in the same direction to the bonding position 1. The motions of the first and second X-Y tables 17, 19 preferably take place substantially simultaneously. The bonded substrate 14 is unloaded and removed from the first work holder WH1. The CCD camera 11 carries out pattern recognition and visually aligns the LED board 20 on the substrate 22 which is mounted on the second work holder WH2 at the bonding position 1 before wire bonding by the bond head 10 commences.

Thereafter, another substrate with an unbonded LED board may be loaded onto the first work holder WH1 to replace a bonded LED board while the LED board on the second work holder WH2 is being bonded, and the operations as described in FIG. 1A to 1D are repeated.

In this embodiment, the use of multiple X-Y tables 17, 19 allows bonding to be performed simultaneously with loading/unloading of substrates onto the work holders WH1, WH2. That is, non-productive operations such as loading/unloading can be conducted in parallel with the productive bonding operations. As a result, UPH of the wire-bonding system is increased as compared to the UPH when only one X-Y table is used which requires the operations of loading/unloading, visual alignment and bonding to be sequential.

FIGS. 2A to 2F are functional block diagrams illustrating an exemplary wire bonding sequence according to a second preferred embodiment of the invention, wherein dual X-Y tables 17, 19 and three optical systems with a CCD camera 11, 29, 31 each are in operation. The bonding position 1, first loading/unloading position 2 and second loading/unloading position 3 would thus comprise a center CCD camera 11, a left CCD camera 29, and a right CCD camera 31 respectively.

Figure 2A:
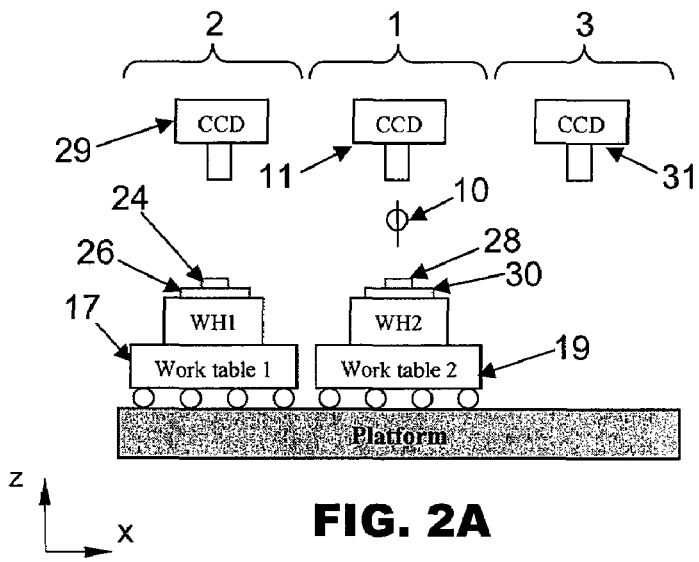
FIGS. 2A to 2F are functional block diagrams illustrating an exemplary wire bonding sequence according to a second preferred embodiment of the invention, wherein dual X-Y tables and three optical systems with a CCD camera each are in operation.

In FIG. 2A, two substrates 26, 30 separately holding two LED boards 24, 28 are on the first work holder WH1 and the second work holder WH2 respectively. The second X-Y table 19 is positioned under the center CCD camera 11 located at the bonding position 1 whereas the first X-Y table 17 is positioned under the left CCD camera 29 at the first loading/unloading position 2. The left CCD camera 29 carries out pattern recognition of the LED board 24 on the first work holder WH1 at the first loading/unloading position 2 so that it is visually aligned for wire bonding. The LED board 28 on the second work holder WH2 has been visually aligned and bond head 10 carries out wire bonding on the substrate 30 at the bonding position 1.

Figure 2B:
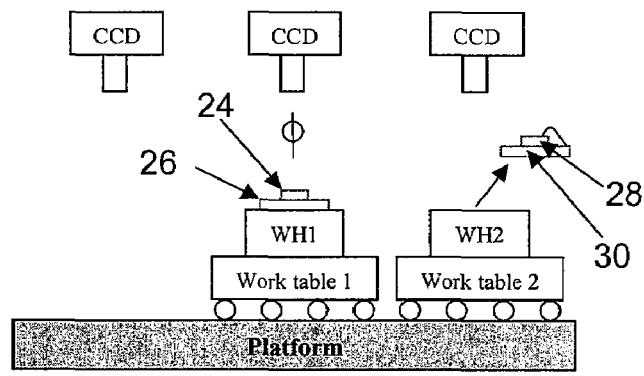

After bonding is completed on the substrate 30 on the second work holder WH2, the second X-Y table 19 moves to the right in the x direction and the first X-Y table 17 independently moves to the right in the same direction as shown in FIG. 2B. The bonded substrate 30 is unloaded from the second work holder WH2 while bonding commences on the substrate 26 on the first work holder WH1.

Figure 2C:
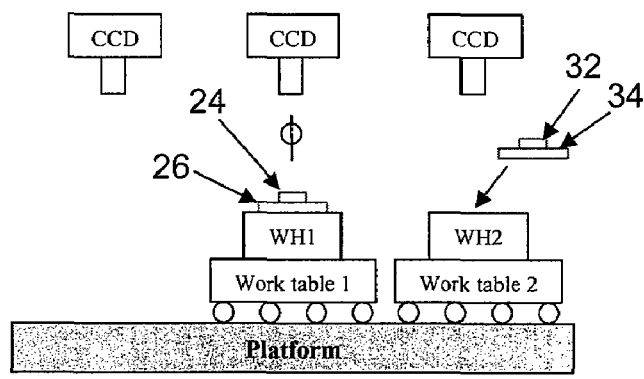
Figure 2D:
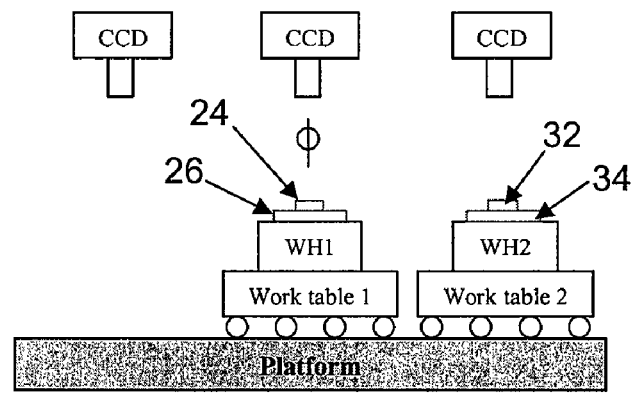

In FIG. 2C, another substrate 34 with an unbonded LED board 32 is loaded onto the second work holder WH2 on the second X-Y table 19 to replace the bonded substrate 30 while bonding continues on the first work holder WH1. After loading, pattern recognition of the unbonded LED board 32 is conducted at the second loading/unloading position 3 while bonding continues on the substrate 26 on the first work holder WH1 as shown in FIG. 2D.

Figure 2E:
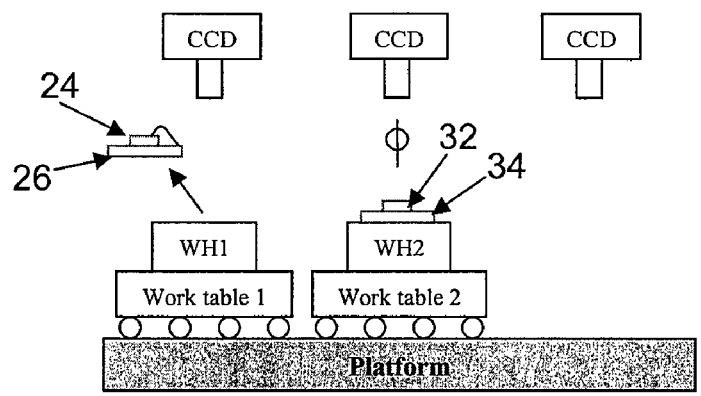

In FIG. 2E, after bonding is completed on the substrate 26 on the first work holder WH1, the first X-Y table 17 moves to the left in the x direction and the second X-Y table 19 independently moves to the left in the same direction. The bonded substrate 26 on the first work holder WH1 is unloaded at the first loading/unloading position 1 while bonding commences on the substrate 34 on the second work holder WH2 at the bonding position 1.

Figure 2F:
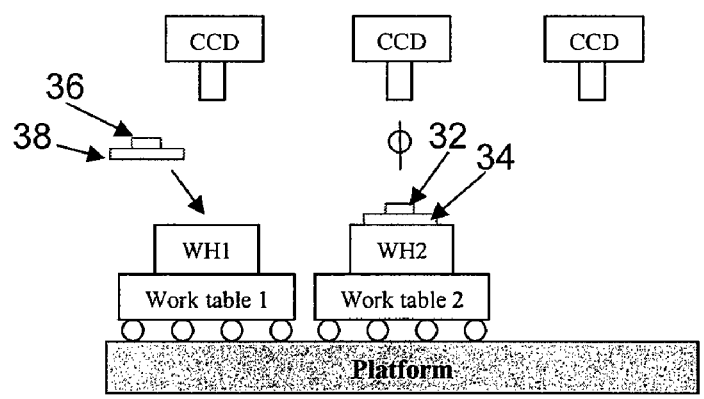

Another unbonded substrate 38 with an LED board 36 is loaded onto the first work holder WH1 to replace the bonded substrate 26 as shown in FIG. 2F while bonding is carried out on the substrate 34 on the second work holder WH2 at the bonding position 1. The operations described in FIG. 2A to 2E are repeated for bonding further devices.

As with the wire bonding system of the first preferred embodiment, the productive bonding operation can be performed in parallel with the non-productive loading/unloading and pattern recognition operations to increase UPH. In the wire bonding system of the first preferred embodiment, the non-productive pattern recognition operation and the productive bonding operation are conducted consecutively although they are conducted in parallel with the non-productive loading/unloading operation. In the wire bonding system of the second preferred embodiment, the productive bonding operation is on a separate X-Y table from all the non-productive operations, namely loading/unloading and pattern recognition. This means that bonding may be continuous and performed in parallel with the non-productive operations at all times. Therefore, UPH of the wire bonding system of the second preferred embodiment may be higher than that of the first preferred embodiment.

FIGS. 3A to 3F are functional block diagrams illustrating the wire bonding sequence according to the second preferred embodiment of the invention with an additional post-bond inspection operation of the bonded substrate after completion of the wire bonding operation.

Figure 3A:
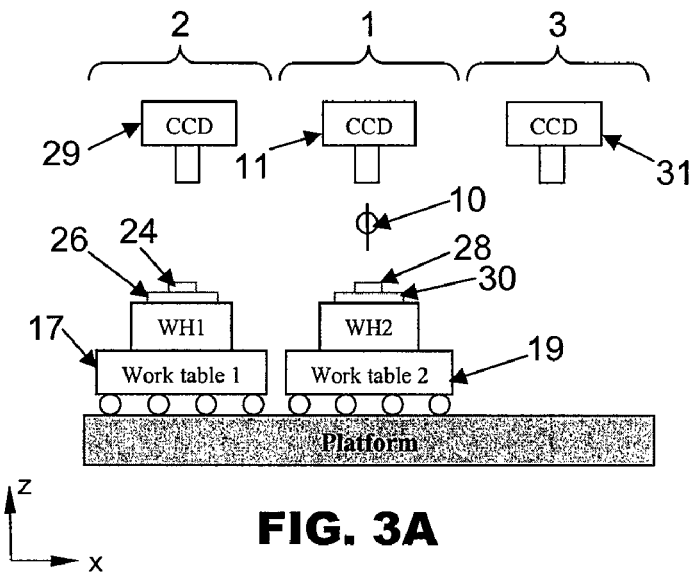
FIGS. 3A to 3F are functional block diagrams illustrating the wire bonding sequence according to the second preferred embodiment of the invention with an additional post-bond inspection operation of the bonded substrate after completion of the wire bonding operation.

FIG. 3A illustrates the same physical arrangement of three CCD cameras 11, 29, 31 and a bond head 10 centrally located on the platform at the bonding position 1 as with FIG. 2A of the second preferred embodiment of the present invention. Bonding is carried out at the bonding position 1 on the substrate 30 carrying the LED board 28 mounted on the second work holder WH2. Pattern recognition of the LED board 28 on the second work holder WH2 at the second loading/unloading position 3 has already been completed, whereas pattern recognition and visual alignment of the LED board 24 is in progress at the first work holder WH1.

Figure 3B:
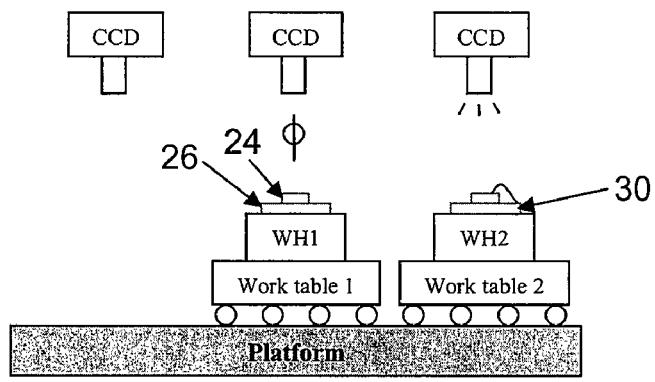

In FIG. 3B, after wire bonding is completed on the substrate 30 on the second work holder WH2 at the bonding position 1, the second X-Y table 19 moves to the right in the x direction and the first X-Y table 17 independently moves to the right in the same direction. Unlike in the case of the second preferred embodiment of the invention, the bonded substrate 30 is not unloaded from the second work holder WH2 on the second X-Y table 19 immediately. Visual post-bond inspection of the bonded substrate 30 is conducted by the right CCD camera 31 at the second loading/unloading position 3 while bonding on the substrate 26 at the first work holder WH1 is in progress at the bonding position 1. The longer the first X-Y table 17 is occupied by bonding, the more idle time is available at the second loading/unloading position 3 which may be utilised for substantially simultaneous post-bond inspection of the bonded substrate 30 on the second X-Y table 19.

Figure 3C:
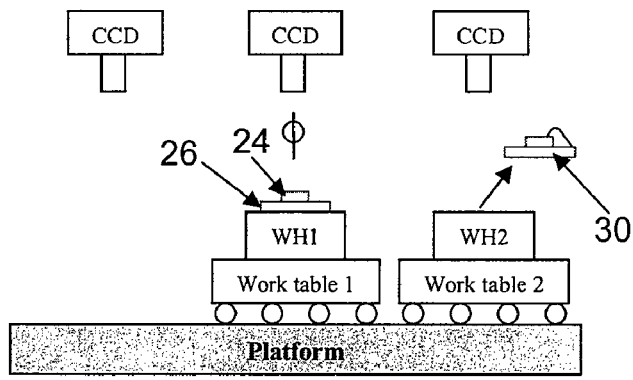

In FIG. 3C, after post-bond inspection is completed at the second loading/unloading position 3, the bonded substrate 30 is unloaded from the second work holder WH2 while bonding continues on the substrate 26 on the first work holder WH1 at the bonding position 1. Another unbonded substrate 34 with an LED board 32 is loaded onto the second work holder WH2 on the second X-Y table 19 and pattern recognition is conducted on the LED board 32 at the second loading/unloading position 3. At the same time, bonding continues on the substrate 26 at the first work holder WH1 at the bonding position 1.

Figure 3D:
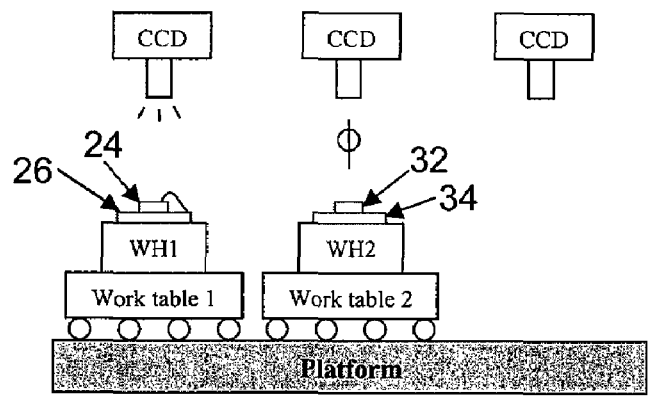

In FIG. 3D, the first X-Y table 17 moves to the left in the x direction after bonding is completed on the substrate 26 and the second X-Y table 19 independently moves to the left in the same direction. Bonding commences on substrate 34 on the second work holder WH2 at the bonding position 1 while post-bond inspection is carried out on the bonded substrate 26 on the first work holder WH1 with the left CCD camera 29 at the first loading/unloading position 2.

Figure 3E:
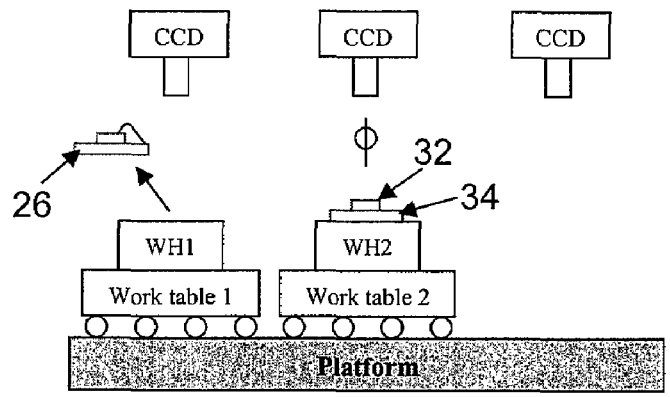
Figure 3F:
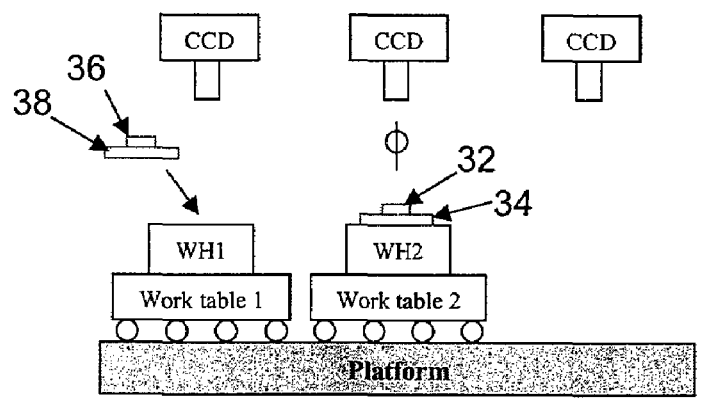

FIG. 3E shows the unloading of the bonded substrate 26 at the first loading/unloading position 2 after post-bond inspection while bonding continues on the substrate 34 at the bonding position 1. Another unbonded substrate 38 mounted with an LED board 36 is loaded onto the first work holder WH1 while bonding continues on the other substrate 34 as shown in FIG. 3F. The operations described in FIG. 3A to 3E are repeated for wire bonding further devices.

This third embodiment of the invention enables the first X-Y table 17 to utilize idle time resulting from simultaneous bonding at the second X-Y table 19. After loading/unloading and pattern recognition are completed at the first X-Y table 17, the first X-Y table 17 would be left idle while awaiting the completion of bonding at the second X-Y table 19. The idle time is longer when the wires per substrate increases and bonding time correspondingly increases. This extra idle time at the first X-Y table 17 is utilised efficiently for post-bond inspection of the bonded substrate before it is unloaded. Idle time for post-bond inspection is generally not available in the conventional wire bonding system which uses one X-Y table since UPH may be significantly reduced as a result. This third embodiment makes available the option of post-bond inspection without significantly decreasing UPH.

Figure 4:
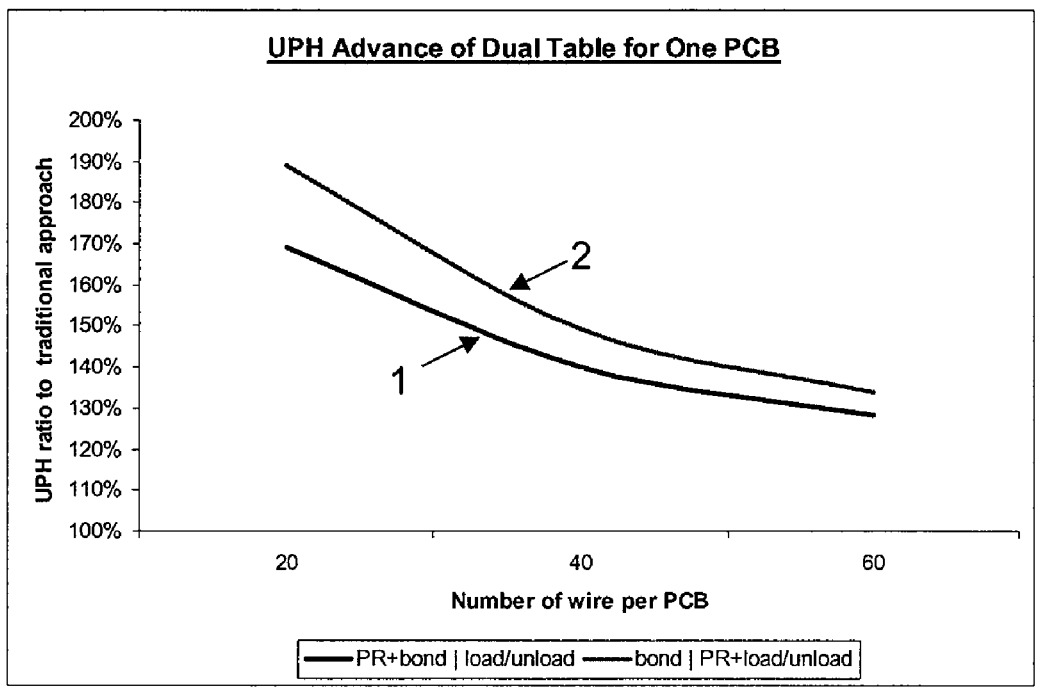
FIG. 4 is a graph illustrating the efficiencies of the wire bonding systems according to the first and second preferred embodiments of the invention for bonding one material on one substrate as compared with a conventional wire bonding system.

FIG. 4 is a graph illustrating the efficiencies of the wire bonding systems according to the first and second preferred embodiments of the invention for bonding one material on one substrate as compared with a conventional wire bonding system.

The typical bonding speed of the aluminum or wedge wire bonding system is about 4-8 wires per second and the typical pattern recognition time is about 0.1-0.3 seconds per alignment point. The time taken by the X-Y tables 17, 19 to move from a bonding position to a loading position is 0.4-0.8 seconds and manual loading/unloading time is typically 4-6 seconds.

From modelling the production UPH with some of these figures, graph 1 represents the UPH obtained by the first preferred embodiment as compared to that of a conventional wire bonding system for different number of wires per PCB on one substrate, wherein the pattern recognition and bonding are carried out on one X-Y table while loading/unloading is carried out on another X-Y table simultaneously.

Graph 2 represents the UPH obtained by the second preferred embodiment as compared to that of a conventional wire bonding system for different numbers of wires per PCB on one substrate, wherein bonding is carried out on one X-Y table while pattern recognition and loading/unloading are carried out on another X-Y table simultaneously.

Both graphs show a marked increase in UPH over the conventional single-table wire bonding system. For example, when wire bonding of 20 wires per PCB is carried out, graph 1 shows a 70% UPH increase over the conventional wire bonding system while the graph 2 shows a 90% UPH increase. This graphical representation also illustrates that the second preferred embodiment as represented by graph 2 is more efficient than the first preferred embodiment represented by the graph 1. It is noted in the second preferred embodiment that the productive bonding operations are carried out on one X-Y table while the non-productive operations of pattern recognition and loading/unloading are carried out on another X-Y table. This allows wire bonding to be carried out at all times while either pattern recognition or loading/unloading is being conducted on the other X-Y table. This is not the case in the first preferred embodiment as time is allocated for both pattern recognition and bonding operations on the same X-Y table, thus reducing UPH.

Another feature illustrated by graphs 1 and 2 is that the lower the number of wires per PCB, the higher the UPH is increased over the conventional wire bonding system.

Figure 5:
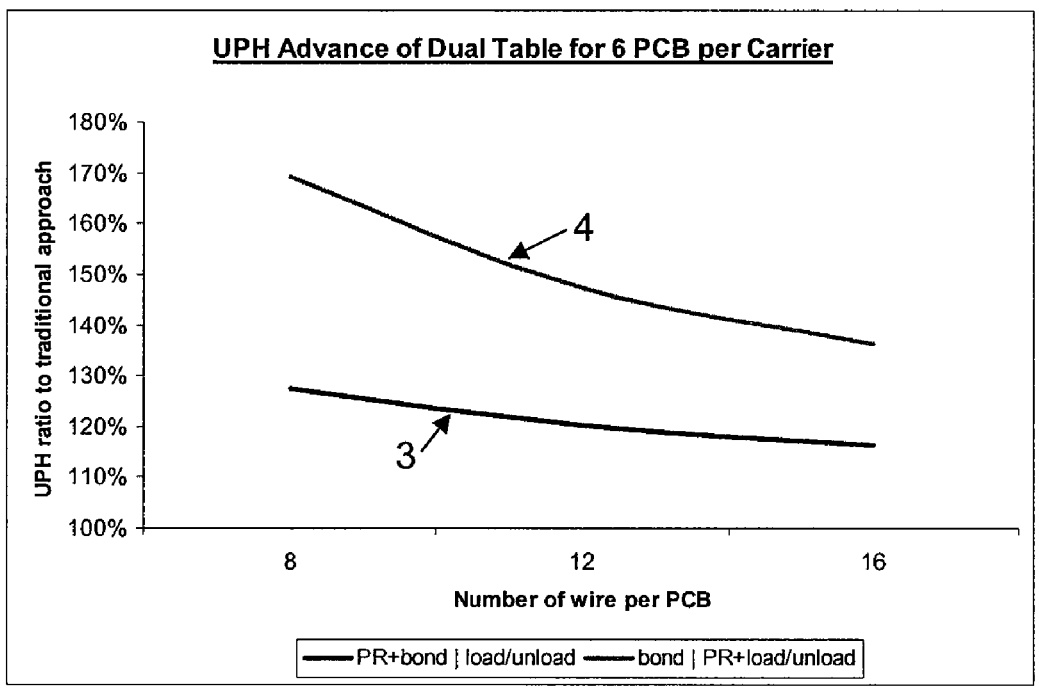
FIG. 5 is a graph illustrating the efficiencies of the wire bonding systems according to the first and second preferred embodiments of the invention when bonding multiple materials on one substrate as compared with a conventional wire bonding system.

FIG. 5 is a graph illustrating the efficiencies of the wire bonding systems according to the first and second preferred embodiments of the invention when bonding multiple materials on one substrate as compared with a conventional wire bonding system. More specifically, six pieces of material such as semiconductor chips are mounted on each substrate. Graphs 3 and 4, representing the first and second preferred embodiments respectively, show an increased UPH over the conventional wire bonding system. For example, for bonding 8 wires per PCB, the graph 3 shows a 30% UPH increase while the graph 4 shows a 70% UPH increase. The graphs 3, 4 also show that the lower the number of wires per PCB the more efficient the bonding system is over the conventional wire bonding system.

Figure 6:
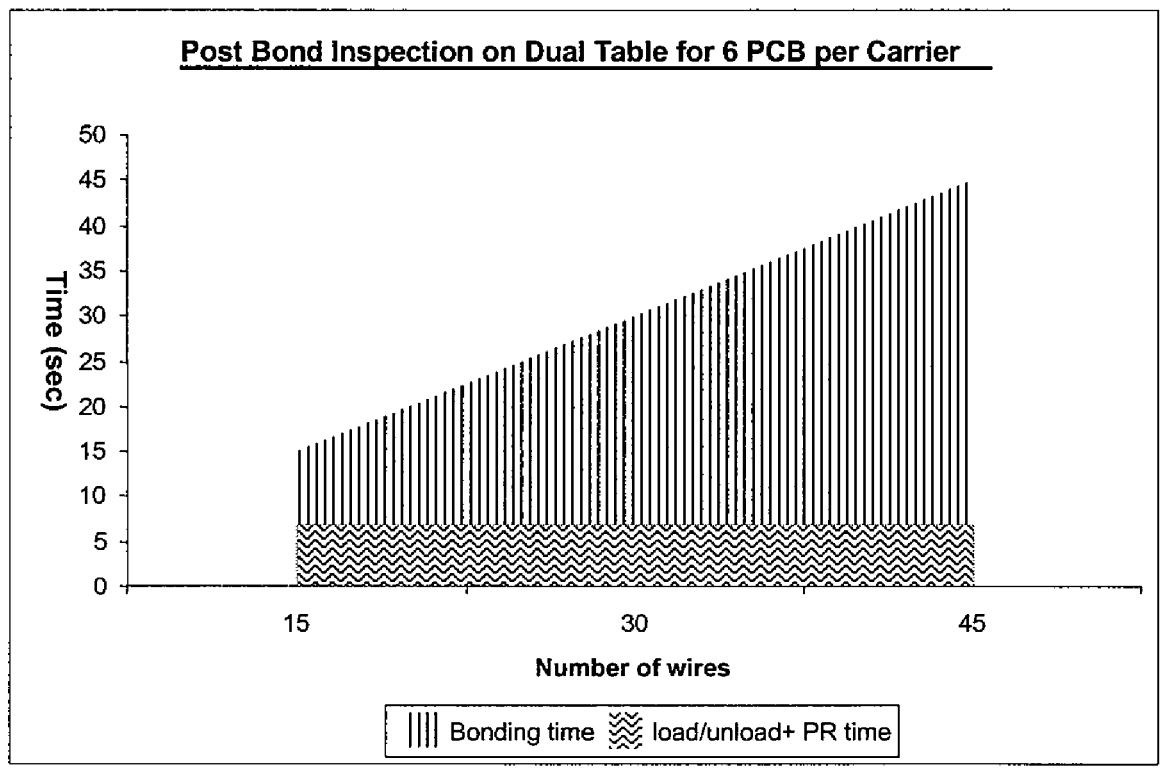
FIG. 6 is a graphical representation of the amount of idle time available for post-bond inspection in relation to the number of wires to be bonded for bonding multiple materials on one substrate.

FIG. 6 is a graphical representation of the amount of idle time available for post-bond inspection in relation to the number of wires to be bonded for bonding multiple materials on one substrate, and in particular, in a six PCB per substrate system. A fixed amount of time is used for loading/unloading and pattern recognition at a first X-Y table irrespective of the number of wires to be bonded, whereas the time utilized for bonding increases with the number of wires to be bonded. The graph illustrates that more idle time is available for post-bond inspection when a longer bonding time is required for bonding more wires. When shorter idle time is available, sampling post-bond inspection may be performed instead.

It should be appreciated that wire bonding systems with multiple positioning tables in accordance with the preferred embodiments of the invention provides various advantages. The productive wire bonding operations can be carried out simultaneously with other non-productive operations, which is not possible in the case of a conventional wire bonding system using only one X-Y table as the operations must be sequential. Higher UPH can be achieved as a result. Additionally, as demonstrated by the second preferred embodiment, when the productive bonding operation is the only operation carried out on one X-Y table while the non-productive operations such as loading/unloading and pattern recognition are carried out on another X-Y table simultaneously, UPH achievable is further improved. The third preferred embodiment also provides additional idle time which can be utilized for post-bond inspection at one X-Y table while bonding is carried out on the other X-Y table. Longer time is available for post-bond inspection when longer bonding time is required for bonding more wires per device. Furthermore, it is observed that the increase in UPH obtained with the preferred embodiments of the invention over the conventional wire bonding system is particularly prominent in applications when the time comprising loading/unloading time, visual alignment and/or post-bond inspection time is significant in comparison with the bonding time.

The configuration in the preferred embodiments also allow the system to perform the conventional sequential wire bonding operations on a single X-Y table by disabling the other X-Y tables and work holders. This provides a flexibility to perform the conventional sequential bonding system when required.

Although the described embodiment of the invention comprises two rotary XY tables, the invention can also be applied to bonding systems with other machine configurations. For example, the bonding head may be movable in the Y axis while a rotary table movable in only the X axis carries the device to be bonded. In this case, only an additional rotary table that is movable in the X axis needs to be added to help to reduce the loading time.

The invention described herein is susceptible to variations, modifications and/or additions other than those specifically described and it is to be understood that the invention includes all such variations, modifications and/or additions which fall within the spirit and scope of the above description.

The invention claimed is:

1. Method of bonding wires onto electronic devices comprising the steps of:
 a. mounting first and second electronic devices onto separate first and second positioning tables;
 b. positioning the first positioning table at a bonding position having a bonding tool and bonding the electronic device mounted on the first positioning table with the bonding tool;
 c. moving the first positioning table to a first loading and unloading position to remove the bonded electronic device from the first positioning table and replacing it with an unbonded electronic device at the first loading and unloading position;
 d. independently moving the second positioning table to the bonding position vacated by the first positioning table and bonding the electronic device mounted on the second positioning table with the bonding tool;
 e. moving the second positioning table to a second loading and unloading position different from the first loading and unloading position to remove the bonded electronic device from the second positioning table and replacing it with an unbonded electronic device at the second loading and unloading position; and
 f. independently moving the first positioning table to the bonding position vacated by the second positioning table and bonding the electronic device mounted on the first positioning table with the bonding tool.

2. Method of bonding wires as claimed in claim 1, further comprising the step of thereafter moving the first positioning table to the first loading and unloading position to remove the bonded electronic device from the first positioning table and replacing it with an unbonded electronic device, and independently moving the second positioning table from the second loading and unloading position to the bonding position and bonding the electronic device mounted on the second positioning table with the bonding tool.

3. Method of bonding wires as claimed in claim 1, wherein the step of bonding the electronic device mounted on the second positioning table is conducted at the same time as the step of removing the bonded electronic device from the first positioning table and replacing it with an unbonded electronic device.

4. Method of bonding wires as claimed in claim 1, wherein step f. of bonding the electronic device mounted on the first positioning table is conducted at the same time as step e. of removing the bonded electronic device from the second positioning table and replacing it with an unbonded electronic device.

5. Method of bonding wires as claimed in claim 1, wherein the steps of moving the first positioning table between the first loading and unloading position and the bonding position are conducted substantially simultaneously with the steps of moving the second positioning table between the second loading and unloading position and the bonding position.

6. Method of bonding wires as claimed in claim 1, wherein the bonding position, first loading and unloading position and second loading and unloading position each comprises an optical system.

7. Method of bonding wires as claimed in claim 6, further comprising the step of performing pattern recognition of an unbonded electronic device mounted on the first or second positioning table with the optical system at the first or second loading and unloading position after the step of removing a bonded electronic device and replacing it with the unbonded electronic device on the first or second positioning table.

8. Method of bonding wires as claimed in claim 7, wherein the step of performing pattern recognition of the electronic device mounted on the first or second positioning table with the optical system at the first or second loading and unloading position is conducted substantially simultaneously with the step of bonding an electronic device mounted on the second or first positioning table respectively at the bonding position.

9. Method of bonding wires as claimed in claim 6, further comprising the step of performing post-bond visual inspection of a bonded electronic device mounted on the first or second positioning table with the optical system at the first or second loading and unloading position after the step of bonding the electronic device by the bonding tool at the bonding position.

10. Method of bonding wires as claimed in claim 9, wherein the step of performing post-bond visual inspection of a bonded electronic device mounted on the first or second positioning table with the optical system at the first or second loading and unloading position is conducted substantially simultaneously with the step of bonding an electronic device mounted on the second or first positioning table respectively at the bonding position.

\* \* \* \* \*